Sept. 28, 1965 R. D. FRENCH ETAL 3,209,165

TUNNEL DIODE NOR CIRCUIT

Filed Oct. 16, 1961

WITNESSES

Leon J. Taza

William L. Gates

INVENTORS

Richard D. French and

Herold D. Ausfresser

BY Ernest P. Klipfel

ATTORNEY

United States Patent Office 3,209,165
Patented Sept. 28, 1965

3,209,165
TUNNEL DIODE NOR CIRCUIT

Richard D. French, Arnold, and Harold D. Ausfresser, Baltimore, Md., assignors to Westinghouse Electric Corporation, East Pittsburgh, Pa., a corporation of Pennsylvania Filed Oct. 16, 1961, Ser. No. 145,357
2 Claims. (Cl. 307—88.5)

The present invention relates generally to semiconductor logic circuits and more particularly relates to a circuit utilizing semiconductor means such as tunnel diodes to provide the NOR logic function.

The advent of tunnel diodes and other semiconductor devices exhibiting similar voltage ampere characteristics has provided attractive properties for their use in circuits performing binary logic functions. Because these devices exhibit the phenomena of quantum mechanical tunneling, extremely high switching speeds are attainable. In addition, their low power consumption, small size and relative insensitivity to environmental conditions make them particularly adaptable to computer applications.

Tunnel diode circuits are limited in their usefulness, however, by the narrow tolerances usually required. In particular, difficulty has been experienced in the development of inverters or NOR tunnel diode gates and in some cases transistors have been employed in an otherwise all tunnel diode system to provide this function.

It is an object of the present invention therefore to provide a logic circuit for performing the NOR logic function.

Another object of the present invention is to provide a logic NOR circuit utilizing semiconductor devices exhibiting phenomena of quantum mechanical tunneling.

Another object is to provide a logic circuit having unilateral signal flow properties.

Still another object is to provide a NOR logic circuit which operates with wide tolerance parameters.

Further objects and advantages of the present invention will be readily apparent from the following detailed description taken in conjunction with the drawings, in which.

Figures 1, 1A, 2, 3, 4:
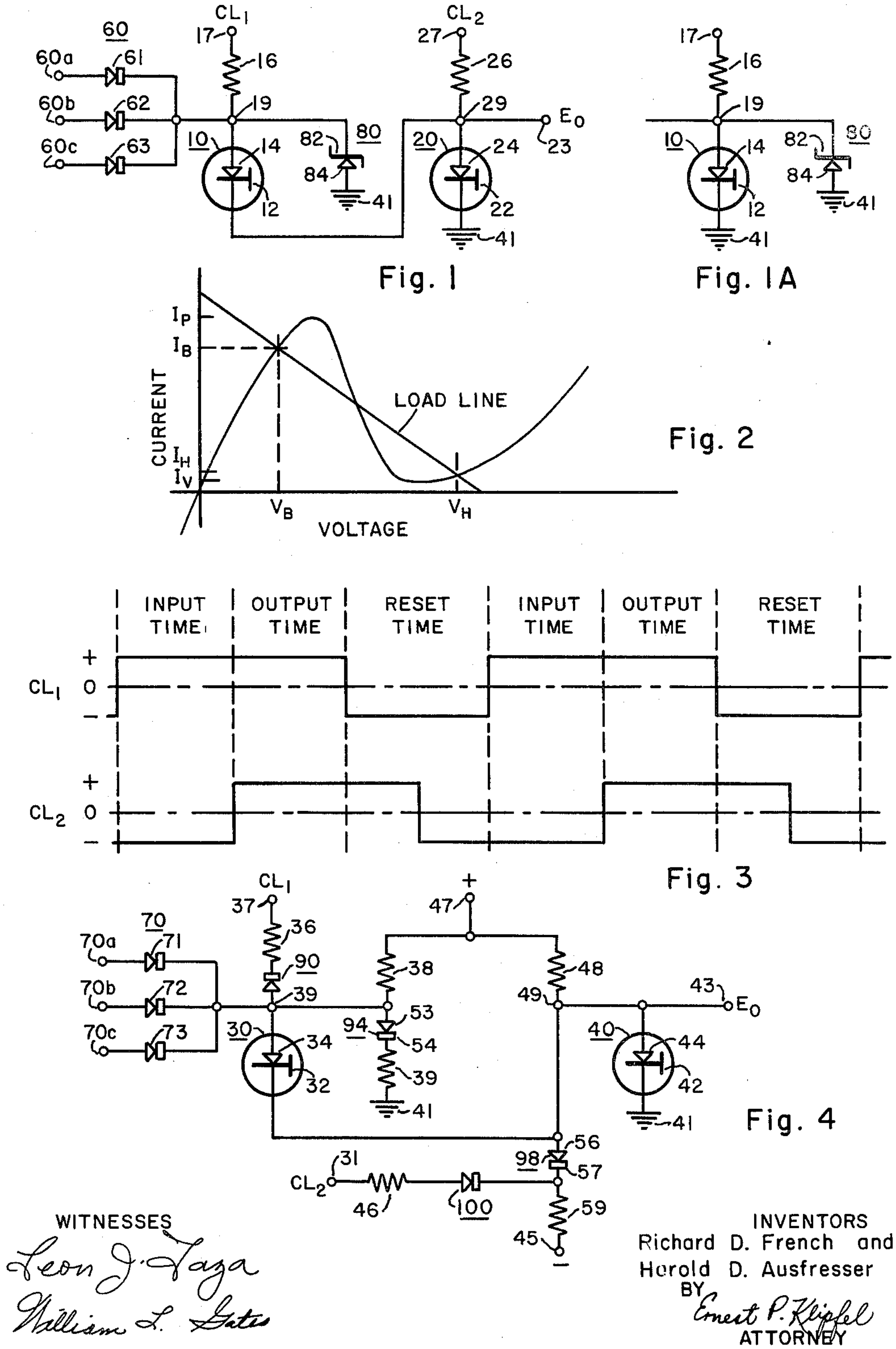
FIGURE 1 is an electrical circuit diagram of an illustrative embodiment of the present invention.
FIGURE 1A is an effective equivalent circuit of the circuit shown in FIGURE 1 during the input time interval.
FIGURE 2 illustrates the characteristic curve of a tunnel diode, particularly a tunnel diode biased to operate as a one unit input level device.
FIGURE 3 illustrates the overlapping time sequence of the clock voltages which are necessary for proper operation of the subject invention.
FIGURE 4 is an alternate embodiment of the present invention.

FIGURE 1 illustrates a first embodiment of the present invention. Tunnel diodes 10 and 20 are connected such that the cathode 12 of tunnel diode 10 is connected directly to the anode 24 of tunnel diode 20. Input signals are fed through a plurality of input terminals 60*a*, 60*b* and 60*c* to the anode 14 of tunnel diode 10, while the output is taken from the anode 24 of tunnel diode 20 at terminal 23. Input means 60 are illustrated as comprising semiconductor diodes 61, 62 and 63; however, it is to be understood that while three diodes have been illustrated any suitable number may be so connected. The input means 60 comprising diodes 61, 62 and 63 are connected together and form a junction 19 which is electrically connected to the anode 14 of tunnel diode 10. The cathode 22 of tunnel diode 20 is connected to a point of ground potential 41.

In order that signal flow might be directed through the subject invention a first and second clock voltage is necessary. These clock voltages are supplied from sources, not illustrated, and are designated CL1 and CL2, respectively. CL1 is impressed upon the circuit shown in FIGURE 1 at terminal 17, while CL2 is impressed upon said circuit at terminal 27. The first clock voltage CL1 is fed to tunnel diodes 10 and 20 through resistance 16 whereas the second clock voltage CL2 from terminal 27 is fed directly to the anode of tunnel diode 20 through resistance 26 forming a junction 29.

Binary positive logic has been utilized to illustrate the present invention; that is, a lower magnitude signal is designated binary "zero" state while a higher magnitude or more positive signal is designated as the binary "one" state.

It is to be understood that the NOR logic function provides an output "one" only when a binary "zero" is present at all of the input terminals, namely, 60*a*, 60*b* and 60*c*. However, should a binary "one" input be present at any one or more of the input means 60 no output will occur from the logic circuit thereby presenting a binary "zero."

The NOR logic circuit constituting the present invention basically comprises the two inter-connected tunnel diodes 10 and 20 having means whereby triggering of the first tunnel diode 10 during an input time interval will prevent the triggering of the second tunnel diode 20 during an output time interval, but wherein the absence of any triggering of diode 10 during the input time interval will cause triggering the second tunnel diode 20 during the output time interval. In this manner a phase inversion is effected.

A characteristic curve of a semiconductor device such as the tunnel diode is shown in FIGURE 2. For reverse bias, the resistance of the tunnel diode device shown in FIGURE 2 is small. In the forward direction, with an increase of the voltage across the tunnel diode, the current therethrough increases to a sharp maximum $I_P$ on a portion of the characteristic curve to be referred to as the low voltage side or "zero" state. Further increase in the voltage across the diode results in the negative resistance portion of the characteristic curve wherein the current through the diode drops to a deep and broad minimum, referred to as the valley current $I_V$. The negative resistance portion of the characteristic curve is often described in the art as the negative conductance region. Still further increase in the voltage across the diode causes the current to increase again on a portion of the characteristic curve to be referred to as the high voltage side or "one" state. The current increases to a maximlm value shown as $V_H$ as determined by the circuit parameters determining the load line as indicated. A threshold occurs at $I_P$ due to the peak tunneling current and is referred to as the threshold or breakover level of the tunnel diode. For the purposes of this invention, the term "tunnel diode" is herein meant to include all devices exhibiting the aforementioned characteristics.

FIGURE 2 in addition to showing the characteristic curve of the tunnel diode also shows the bias conditions for a one unit input level device. A one unit input level device is one in which a binary "one" input signal at any one or more of the input terminals say 60*a*, 60*b* and 60*c* will trigger the device to its high voltage or "one" state. For example, a tunnel diode would be biased by a clock source to its low voltage side signifying a "zero" state at point $V_B$ resulting in a current flow of $I_B$. A one unit level input will be sufficient to exceed the peak current $I_P$, resulting in a switching of static state to point $V_H$ signifying a "one" state. The "one" state at $V_H$ will result in a corresponding current flow of $I_H$.

The two clock voltages CL1 and CL2 are shown in time relationship in FIGURE 3. The two clock potentials overlap such that CL1 goes from a negative potential at the beginning of the input time interval to a positive potential and remains at the positive potential throughout the input output time intervals, returning to the negative potential at the beginning of a reset time interval. The clock voltage CL2 is at a negative potential during the input time interval; however, it switches to a positive potential during the output time and remains at that level during a portion of the reset time returning to its negative state prior to the succeeding input time interval.

Briefly, the operation of the basic embodiment shown in FIGURE 1 depends basically upon the fact that tunnel diodes 10 and 20 are operated as one unit input level devices in conjunction with the clock voltage sources CL1 and CL2. As stated previously, during the input time, CL1 is a positive voltage and CL2 is a negative voltage. The negative voltage of CL2 during the input time interval holds the potential at junction 29 to a point substantially near zero voltage, becoming a virtual ground in view of tunnel diode 20. The effective equivalent circuit for this particular condition is shown in FIGURE 1A. Since tunnel diode 10 is biased to be responsive to a one unit level input signal during the input time, a binary "one" signal appearing at either of the input diodes 60*a*, 60*b* or 60*c* will switch tunnel diode 10 to its high voltage side or "one" state.

The input means 60 comprising diodes 61, 62, and 63 are poled such that positive binary "one" signals pass into the circuit, but wherein any positive going voltage change at junction 19 is prevented from passing back through the diodes and any preceding circuitry. The presence of the diodes 61, 62 and 63 therefore block signal flow in the reverse direction but conduct normally in the forward direction thereby obtaining a unilateral signal flow.

If tunnel diode 10 is switched to its high voltage binary "one" state during the input time interval the potential at point 19 is clamped by means of the semiconductor device 80, which comprises a Zener diode having its cathode 82 connected to junction 19 and its anode connected to the point of common potential 41. The voltage clamp will hold point 19 to a selected voltage level, say 85% of a unitary input signal when tunnel diode 10 switches to its binary "one" state. When the Zener diode 80 conducts the bias current supplied from the clock source applied to terminal 17 now has a parallel path to ground; that is, the bias current previously flowing exclusively through tunnel diode 10 now flows partly through tunnel diode 10 and partly through Zener diode 80. This effect is most important. During the output time interval, CL2 goes positive and the action of Zener diode 80 allows either tunnel diode 10 or tunnel diode 20 to be in the high voltage "one" state but not both. The presence of a positive clock voltage CL2 at point 27 during the output time biases tunnel diode 20 to a one unit input threshold level whereas during the input time interval the presence of the negative clock pulse voltage at 27 virtually removes tunnel diode 20 from the circuit.

If tunnel diode 10 did not switch during the input time interval the bias current flowing through tunnel diode 10 and consequently through tunnel diode 20 presents a one unit or unitary input signal to tunnel diode 20 which when present with the second clock voltage will cause the peak current $I_P$ of tunnel diode 20 to be exceeded, rendering diode 20 to its high voltage state. However, if tunnel diode 10 were switched to its binary "one" state due to its presence of a binary "one" signal at the input means 60, Zener diode 80 conducts and the bias current flowing through tunnel diode 10 is lessened to the extent that there is no longer a unitary input signal present at tunnel diode 20 and therefore tunnel diode 20 will remain in its low voltage "zero" state. From this it can be seen that the circuit inverts; that is, the presence of a binary "zero" input at the input means will provide a binary "one" output at terminal 23 and likewise the presence of a binary "one" at input means 60 will provide a binary "zero" output at terminal 23.

During the reset time interval as shown by FIGURE 3, CL1 goes negative in which case tunnel diodes 10 and 20 are triggered back into their respective low voltage binary "zero" states. Tunnel diode 20 goes into its low voltage binary "zero" state because there is no longer a unitary input level signal coming from tunnel diode 10 due to its low voltage state and consequently reduced current.

FIGURE 4 shows a second embodiment of the present invention. This embodiment operates by the same basic principles described for the first embodiment, FIGURE 1. However, the Zener diode clamp has been replaced by fixed direct-current bias means applied to both the first tunnel diode 30 and the second tunnel diode 40. The use of the direct-current bias voltage allows for wider tolerance variation and symmetrical clock voltages. It is easier to make symmetrical clock than an unsymmetrical clock. The input means 70 and the electrical connection of tunnel diodes 30 and 40 appear substantially as in the first embodiment but the clocking of the tunnel diodes 30 and 40 from one state to another varies to a slight degree.

In the second embodiment a plurality of input means 70(*a*), 70(*b*) and 70(*c*) constituting semiconductor diodes 71, 72 and 73, are connected at a common junction 39. Junction 39 is also connected to the anode 34 of tunnel diode 30 which in turn has its cathode 32 electrically connected to the anode 44 of tunnel diode 40. The cathode 42 of tunnel diode 40 is connected to a point of ground potential 41. In this respect the circuit appears identical to the first embodiment shown in FIGURE 1.

With reference to FIGURE 4, a first clock voltage CL1 from a suitable source, not shown, is fed to the anode 34 of tunnel diode 30 through the combination of resistance 36 and semiconductor diode 90 applied to terminal 39. Diode 90 is poled such that it will conduct only when a negative clock voltage is present. A second clock voltage CL2 from a suitable source, not shown, controls tunnel diode 40 through the combination of resistance 46 and semiconductor diodes 100 and 98, having polarities such that diode 100 conducts when a positive clock voltage appears at terminal 31 but wherein diode 98 becomes back-biased.

Tunnel diode 30 has a fixed direct-current bias potential applied to its anode 34 by means of the voltage divider combination of resistance 38, semiconductor diode 94 and resistance 39, the resistance 38 being adapted to be connected by terminal 47 to a positive bias voltage source, not shown, while resistance 39 is returned to ground potential 41. The positive voltage thus resulting at terminal 39 will bias tunnel diode 30 to its low voltage side or binary "zero" state during the input and output time intervals; however, during the reset time a negative clock voltage is fed from CL1 which will forward bias diode 90 and return tunnel diode 30 to its "zero" state if it has switched to a "one" state during the input time.

The second tunnel diode 40 likewise has a fixed bias applied to its anode 44 at junction 49. This fixed bias is applied by means of the voltage divider composed of resistance 48 connected to the terminal 47, semiconductor 98, and a resistance 49 returned to a source of negative bias potential, not shown, applied to terminal 45. During the input time interval, referring to FIG. 3, CL1 is positive and CL2 is negative, back biasing clock diodes 90 and 100 respectively. The negative bias voltage which is supplied to terminal 45 pulls the potential at junction 49 to value of approximately zero volts. Since junction 49 is common to the output terminal 43, the output is also at zero volts. This results in a circuit equivalent to that shown in FIG. 1A.

An input signal having a one unit or unitary input level constituting a binary "one" placed on any of the input diode means 71, 72, or 73 during the input time interval will cause tunnel diode 30 to switch to the high voltage "one" state. During the output time interval the first clock voltage CL1 remains positive but the second clock voltage CL2 now goes positive thereby back biasing diode 98. This causes an open circuit in the voltage divider from terminal 31 to terminal 45 thus causing junction 49 to float with respect to ground potential.

The diode 94 in series relationhip with resistance 39 acts as a voltage clamp on the potential at junction 39. This is similar to the Zener diode clamp utilized in the first embodiment shown in FIG. 1. The action of the clamp allows either tunnel diode 30 or 40 to be in the high voltage "one" state but not both. This occurs because tunnel diode 40 is biased such that if tunnel diode 30 remains in the low voltage "zero" state during the input time interval all the bias current flowing therein will pass into tunnel diode 40, acting as a trigger signal, causing it to switch to its high voltage "one" state. If tunnel diode 30, however, was triggered to its high voltage "one" state during the input time, tunnel diode 40 will stay in the low voltage "zero" due to the excess bias current flowing into the voltage clamp.

During the reset time interval the clock voltage CL1 goes negative and sets tunnel diode 30 back to its "zero" state. The voltage from the second clock source CL2 likewise goes negative returning the potential at junction 49 to zero volts. With tunnel diode 30 in the "zero" state and terminal 43 at zero potential the circuit becomes ready for input signals at terminals *70a*, *70b*, and *70c* during the succeeding input time interval.

In summation, it can be seen that a high voltage or binary "one" input into any one or more of the input means produces a low voltage or binary "zero" at the output terminal while binary "zeros" into all input means will produce a binary "one" at its output terminal. The tunnel gate described herein provides the NOR function with relatively wide tolerance parameters. Since this circuit is a universal logic element, it is anticipated that logic mechanized in this manner will be the most practical application of tunnel diodes in computers and data processing equipment.

While this invention has been described with a particular degree of exactness for the purposes of illustration, it is to be understood that all equivalents, alterations, and modifications within the spirit and scope of the present invention are herein meant to be included.

We claim as our invention:

1. A semiconductor logic circuit adapted to be connected to a first and second clock voltage source and a first and second direct-current source comprising in combination; a first tunnel diode and a second tunnel diode connected in circuit combination; first means for biasing said first tunnel diode and said second tunnel diode to a unitary input threshold level during an input time interval and an output time interval, said first means including a first resistor, a first diode, and a second resistor connected in series relationship across said first direct-current source; second means operably connected to said second tunnel diode including a third resistor, a second diode, and a fourth resistor connected in series relationship across said first and second direct-current source, and a third diode and a fifth resistor connected to said second clock voltage source for rendering said first means inoperative across said second tunnel diode during the input time interval but combining with said first means during the output time interval to exceed the threshold level of said second tunnel diode; third means including a sixth resistor and a fourth diode for applying said first clock voltage source across said first tunnel diode during a reset time interval; means for limiting the magnitude of current through said second tunnel diode to a value insufficient to allow the threshold level of said second tunnel diode to be exceeded when the threshold level of said first tunnel diode is exceeded; a plurality of input means responsive to a unitary input signal for individually combining with said first means to exceed the threshold level of said first tunnel diode; and output means for providing a unitary signal only when the threshold level of said second tunnel diode is exceeded.

2. A semiconductor logic circuit comprising in combination; a first tunnel diode and a second tunnel diode, each having a low voltage state and a high voltage state, connected in circuit relationship; first means for selectively biasing said first tunnel diode and said second tunnel diode to a one unit input threshold level of said low voltage state during an input time and an output time, said first means including a first and a second voltage divider network connected to a first source of direct-current potential and to said first tunnel diode and said second tunnel diode, respectively; second means including a third voltage divider network connected to said first source of direct-current potential and also to a second source of direct-current potential, said third voltage divider network being operably connected to said second tunnel diode for rendering said first means inoperative across said second tunnel diode during the input time but combining with said first means during the output time to exceed the threshold level of said second tunnel diode when said first tunnel diode remains in said low voltage state; semiconductor means for limiting the magnitude of current through said second tunnel diode to a value insufficient to allow the threshold level of said second tunnel diode to be exceeded when the threshold level of said first tunnel diode is exceeded; a plurality of input means responsive to a one unit input signal for individually combining with said first means to exceed the threshold level of said first tunnel diode; and output means for providing a one unit signal only when the threshold level of said second tunnel diode is exceeded.

References Cited by the Examiner

UNITED STATES PATENTS 3,054,002 9/62 Tendick ------------- 307—88.5

OTHER REFERENCES

G.E. Tunnel Diode Manual, page 59.

R. J. Shaughnessy: "The Zener Diode," Popular Electronics, June 1961, pages 76–82.

Walter F. Kosonocky: "N and Nor Tunnel Diode Logic Network," R.C.A. Technical Notes, Sept. 13, 1961.

ARTHUR GAUSS, *Primary Examiner.*

JOHN W. HUCKERT, *Examiner.*